US010943535B2

(12) United States Patent
Lim

(10) Patent No.: US 10,943,535 B2
(45) Date of Patent: Mar. 9, 2021

(54) ORGANIC LIGHT EMITTING DISPLAY DEVICE AND METHOD FOR DETERMINING GAMMA REFERENCE VOLTAGE THEREOF

(71) Applicant: Samsung Display Co., Ltd., Yongin-si (KR)

(72) Inventor: Hansin Lim, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/162,004

(22) Filed: Oct. 16, 2018

(65) Prior Publication Data

US 2019/0114965 A1 Apr. 18, 2019

(30) Foreign Application Priority Data

Oct. 18, 2017 (KR) ........................ 10-2017-0135445

(51) Int. Cl.
*G09G 3/3233* (2016.01)
*H01L 51/50* (2006.01)

(52) U.S. Cl.
CPC ........... *G09G 3/3233* (2013.01); *H01L 51/50* (2013.01); *G09G 2320/0242* (2013.01); *G09G 2320/0276* (2013.01); *G09G 2320/0666* (2013.01); *G09G 2320/0693* (2013.01); *G09G 2330/028* (2013.01); *G09G 2360/145* (2013.01)

(58) Field of Classification Search
CPC combination set(s) only.
See application file for complete search history.

(56) References Cited

U.S. PATENT DOCUMENTS

2013/0135272 A1* 5/2013 Park ..................... G09G 3/3233 345/211
2013/0162622 A1* 6/2013 Ebisuno .............. G09G 3/3208 345/212
2014/0118228 A1* 5/2014 Kang .................. G09G 3/3233 345/77

FOREIGN PATENT DOCUMENTS

KR 10-2012-0002071 A 1/2012
KR 10-2012-0108445 A 10/2012
KR 10-1439333 B1 9/2014

* cited by examiner

*Primary Examiner* — Christopher E Leiby
(74) *Attorney, Agent, or Firm* — Lewis Roca Rothgerber Christie LLP

(57) ABSTRACT

An organic light emitting display device includes a display panel, a gamma reference voltage generator, and a gamma voltage generator. The gamma reference voltage generator provides the data voltage having a predetermined voltage level to the display panel, changes brightness of the display panel by sequentially reducing the data voltage, determines a critical voltage by comparing a changing amount of the brightness to a predetermined reference changing amount of the brightness, and determines the gamma reference voltage based on the critical.

20 Claims, 7 Drawing Sheets

ORGANIC LIGHT EMITTING DISPLAY DEVICE AND METHOD FOR DETERMINING GAMMA REFERENCE VOLTAGE THEREOF

CROSS-REFERENCE TO RELATED APPLICATION

This application claims priority to and the benefit of Korean Patent Application No. 10-2017-0135445, filed on Oct. 18, 2017 in the Korean Intellectual Property Office (KIPO), the content of which is incorporated herein in its entirety by reference.

BACKGROUND

1. Field

Example embodiments relate generally to a digital-analog converter.

2. Description of the Related Art

Flat panel display (FPD) devices are widely used as a display device of electronic devices because FPD devices are relatively lightweight and thin compared to cathode-ray tube (CRT) display devices. Examples of FPD devices are liquid crystal display (LCD) devices, field emission display (FED) devices, plasma display panel (PDP) devices, and organic light emitting display (OLED) devices. OLED devices have been highlighted as next-generation display devices because OLED devices have various characteristics such as a relatively wide viewing angle, a relatively rapid response speed, a relatively thin thickness, relatively low power consumption, etc.

Generally, organic light emitting display devices display an image based on a data voltage corresponding to a grayscale of an input image data. The data voltage is generated based on a gamma voltage to which a gamma property of the organic light emitting display device is applied. The gamma voltage is generated based on gamma reference voltages. Assuming that the organic light emitting display device have the same property, the gamma reference voltages are equally set. However, when the gamma reference voltages are equally set, a display quality is degraded according to the property of the organic light emitting display device. Recently, various methods for respectively setting gamma reference voltage of the organic light emitting display device is studied.

The above information disclosed in this Background section is only for enhancement of understanding of the background and therefore it may contain information that does not constitute prior art.

SUMMARY

Example embodiments relate generally to a digital-analog converter. For example, some example embodiments of the present invention relate to a digital-analog converter and a driving circuit of a display device having the same.

Some example embodiments provide an organic light emitting display device capable of respectively determining gamma reference voltages based on a property of the organic light emitting display device.

Some example embodiments provide a method for determining gamma reference voltage capable of respectively determining gamma reference voltages based on a property of the organic light emitting display device.

According to some example embodiments of the present invention, an organic light emitting display device includes: a display panel including a plurality of pixels coupled to data lines and gate lines; a gamma reference voltage generator configured to determine a gamma reference voltage and generate the gamma reference voltage; a gamma voltage generator configured to generate a gamma voltage based on the gamma reference voltage; a data driver configured to provide a data voltage generated based on the gamma voltage to the data lines; and a scan driver configured to provide a scan signals to scan lines, wherein the gamma reference voltage generator is configured to provide the data voltage having a predetermined voltage level to the display panel, to change brightness of the display panel by sequentially reducing the data voltage, to determine a critical voltage by comparing a changing amount of the brightness to a predetermined reference changing amount of the brightness, and to determine the gamma reference voltage based on the critical voltage.

According to some embodiments, the gamma reference voltage generator is configured to determine the gamma reference voltage by adding a predetermined margin voltage to the critical voltage.

According to some embodiments, the margin voltage is determined based on a measuring environment of the brightness of the organic light emitting display device.

According to some embodiments, the margin voltage is determined based on a difference of a red driving current, a green driving current, and a blue driving current.

According to some embodiments, the margin voltage is determined according to a display brightness value (DBV) of the organic light emitting display device.

According to some embodiments, the gamma reference voltage generator is configured to determine a black gamma reference voltage.

According to some embodiments, the gamma reference voltage generator is configured to determine a red gamma reference voltage, a green gamma reference voltage, and a blue gamma reference voltage.

According to some embodiments, the gamma reference voltage generator is configured to determine a black gamma reference voltage based on a display brightness value (DBV) of the organic light emitting display device.

According to some embodiments, the gamma reference voltage generator is configured to respectively determine a red gamma reference voltage, a green gamma reference voltage, and a blue gamma reference voltage based on a display brightness value (DBV) of the organic light emitting display device.

According to some embodiments, the gamma reference voltage generator is configured to calculate a difference of a first brightness output from the display panel when a first data voltage is provided to the display panel and a second brightness output from the display panel when a second data voltage is provided to the display panel, and to output the difference as the changing amount of the brightness.

According to some embodiments, the gamma reference voltage is respectively determined by the organic light emitting display devices.

According to some embodiments, the gamma reference voltage generator is coupled to an external brightness measuring device and is configured to receive the brightness of the display panel.

According to some example embodiments of the present invention, in a method for determining a gamma reference voltage of an organic light emitting display device, the method includes: providing a data voltage having a predetermined voltage level to a display panel; measuring a brightness of the display panel as the data voltage is sequentially decreased; determining a critical voltage by comparing a changing amount of the brightness to a predetermined reference changing amount of the brightness; and determining the gamma reference voltage based on the critical voltage.

According to some embodiments, the gamma reference voltage is determined by adding a predetermined margin voltage to the critical voltage.

According to some embodiments, a black gamma reference voltage is determined by adding a margin voltage based on a measuring environment of brightness to the critical voltage.

According to some embodiments, a red gamma reference voltage, a green gamma reference voltage, and a blue gamma reference voltage are respectively determined by adding a red margin voltage, a green margin voltage, and a blue margin voltage calculated by a difference between a red driving current, a green driving current, and a blue driving current to the critical voltage.

According to some embodiments, a black gamma reference voltage is determined by adding a margin voltage calculated based on a display brightness value (DBV) of the organic light emitting display device to the critical voltage.

According to some embodiments, a red gamma reference voltage, a green gamma reference voltage, and a blue gamma reference voltage are respectively determined by adding a margin voltage calculated based on to display brightness value (DBV) of the organic light emitting display device.

According to some embodiments, measuring a brightness of the display panel as the data voltage is sequentially decreased includes: measuring a first brightness output from the display panel when a first data voltage is provided to the display panel; and measuring a second brightness output from the display panel when a second data voltage that is smaller than the first data voltage is provided to the display panel.

According to some embodiments, a voltage level of the first data voltage is determined as the critical voltage when a changing amount of the first brightness and the second brightness is larger than the reference changing amount of the brightness.

Therefore, an organic light emitting display device and a method for determining a gamma reference voltage thereof may generate an adjustable gamma reference voltage by determining a critical voltage based on a brightness of a display panel and determining the gamma reference voltage by adding a margin voltage to the critical voltage. Thus, display quality of the organic light emitting display device may improve.

BRIEF DESCRIPTION OF THE DRAWINGS

Illustrative, non-limiting example embodiments will be more clearly understood from the following detailed description taken in conjunction with the accompanying drawings.

DETAILED DESCRIPTION

Hereinafter, aspects of some example embodiments will be explained in detail with reference to the accompanying drawings.

Figure 1:
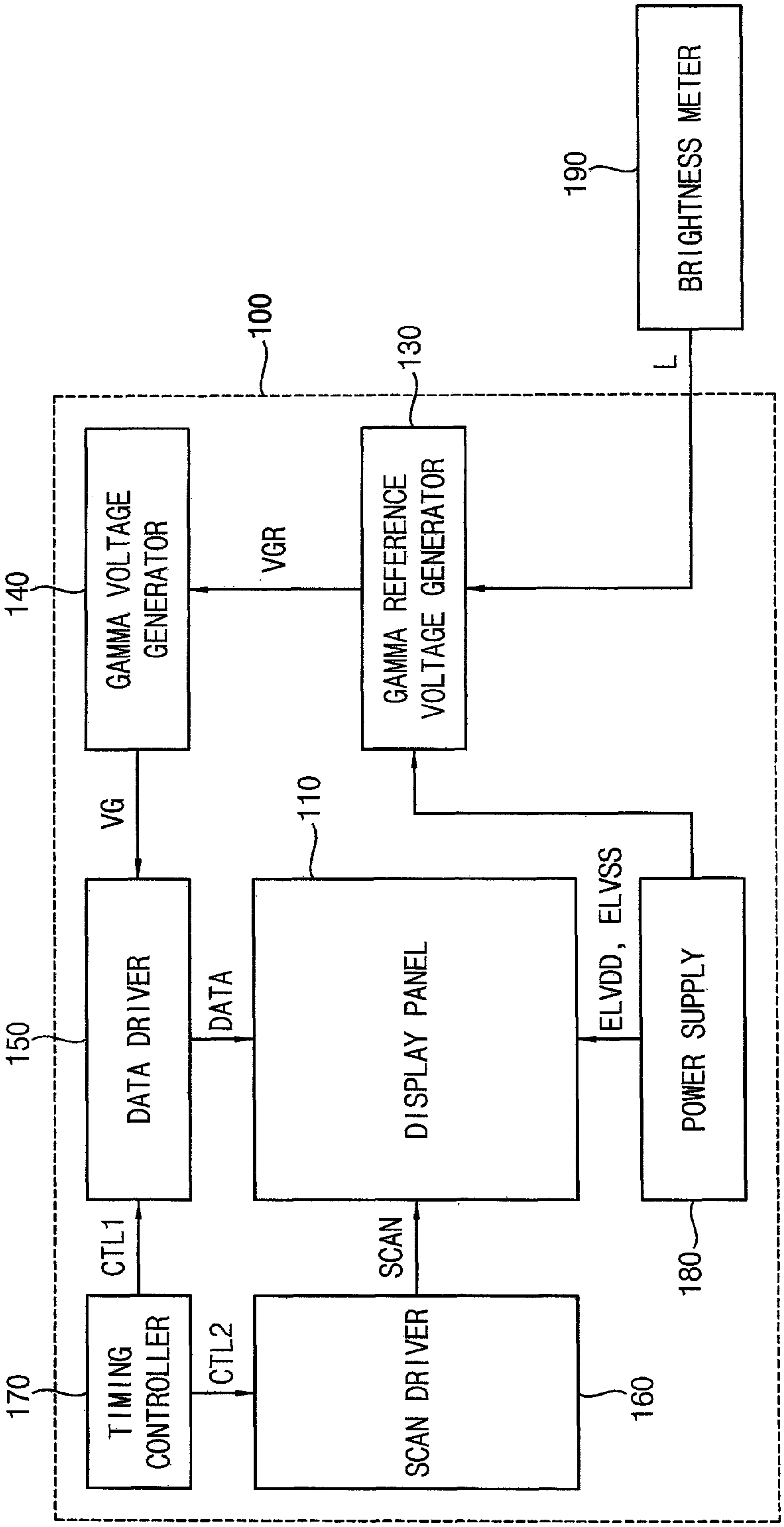
FIG. 1 is a diagram illustrating an organic light emitting display device according to some example embodiments.
Figure 2:
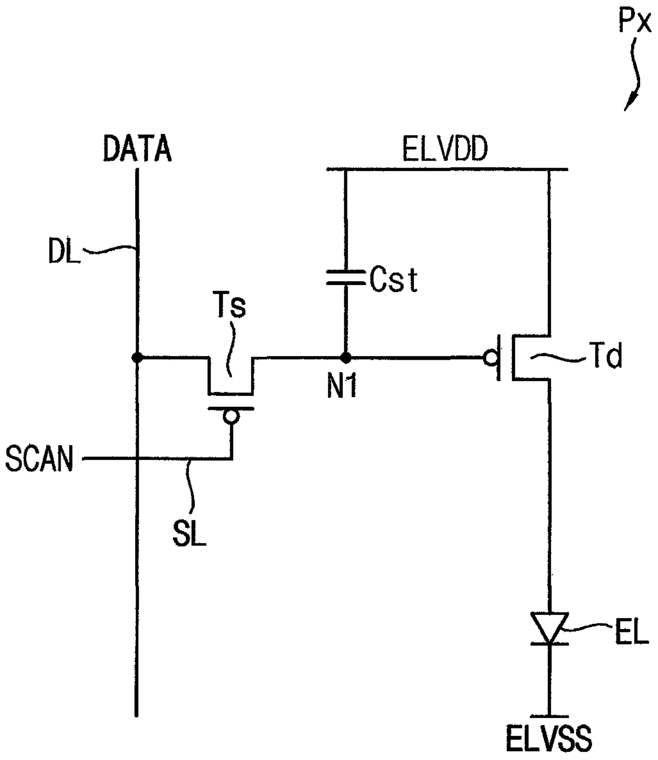
FIG. 2 is a diagram illustrating an example of a pixel included in the organic light emitting display device of FIG. 1.

FIG. 1 is a diagram illustrating an organic light emitting display device according to example embodiments and FIG. 2 is a diagram illustrating an example of a pixel included in the organic light emitting display device of FIG. 1.

Referring FIG. 1, an organic light emitting display device 100 may include a display panel 110, a gamma reference voltage setting part 120, a gamma reference voltage generator 130, a gamma voltage generator 140, a data driver 150, a scan driver 160, a timing controller 170, and a power supply 180.

The display panel 110 may include a plurality of data lines DL and a plurality of gate line crossing the data lines DL. The display panel 110 may include a plurality of pixels coupled to the data lines and the gate lines. Referring to FIG. 2, each of the pixels Px may include an organic light emitting diode EL, a switching transistor, a storage capacitor Cst, and a driving transistor Td. In this case, the driving transistor Td may generate a driving current provided to the organic light emitting diode EL based on a data voltage DATA provided through the data line DL in response to the scan signal SCAN provided through the scan line SL. For example, the switching transistor Ts may turn-on or turn-off in response to the scan signal SCAN provided through the scan line SL. The switching transistor Ts may turn on when the scan signal SCAN having a low level voltage is provided to a gate terminal of the switching transistor Ts. The data voltage DATA provided through the data line DL may be transferred to the storage capacitor Cst through the switching transistor Ts when the switching transistor Ts turn on. The storage capacitor Cst may store the data voltage DATA. The driving transistor Td may generate the driving current based on the data voltage DATA. The organic light emitting diode EL may emit light in response to the driving current provided from the driving transistor Td. The pixel Px of the organic light emitting display device is not limited thereto. For example, the pixel Px further include an emission control transistor that turn-on or turn off in response to an emission control signal and an initialization transistor that provides an initialization voltage to the driving transistor Td and the organic light emitting diode EL.

A brightness of an image displayed on the display panel 110 may be different from each other according to property of the organic light emitting display device 100 although the data voltage having the same voltage level is provided to the display panel 110. Thus, the organic light emitting display device 100 according to some example embodiments may respectively determine the gamma reference voltage VGR by the organic light emitting display device 100. For example, the organic light emitting display device 100 may respectively determine the gamma reference voltages VGR of 0 grayscale by the display panel 110 because a display fault such as a color dragging phenomenon, a first frame response (FFR), etc. occur according to the data voltage of the 0 grayscale (that is, a black color) image.

The gamma reference voltage generator 130 may determine the gamma reference voltage VGR. The gamma reference voltage generator 130 may provide a data voltage having a predetermined voltage level, change brightness of the display panel 110 by sequentially reducing the data voltage, determine a critical voltage by comparing a changing amount of the brightness to a reference changing amount of the brightness (e.g., a predetermined reference changing amount of the brightness), and determine the gamma reference voltage VGR based on the critical voltage.

The gamma reference voltage generator 130 may provide the data voltage DATA having the predetermined voltage level and sequentially reduce the data voltage DATA. The gamma reference voltage generator 130 may be coupled to an external brightness measuring device 190. The brightness measuring device 190 may measure brightness L of the display panel 110 and provide the brightness L of the display panel 110 to the gamma reference voltage generator 130. The brightness L of the display panel 110 may be changed as the data voltage decreases.

The gamma reference voltage generator 130 may determine the critical voltage by comparing the changing amount of the brightness L and the reference changing amount of the brightness. For example, the gamma reference voltage generator 130 may calculate the difference of a first brightness output from the display panel 110 when the first data voltage is provided to the display panel 110 and a second brightness output from the display panel 110 when the second data voltage is provided to the display panel 110 and output the difference as the changing amount of the brightness L.

For example, in a case that the data voltage is 6.0V and decreases as 0.1V, a changing amount of the brightness L is 0 nit when the data voltage is changed from 6.0V to 5.9V, a changing amount of the brightness L is 0.01 nit when the data voltage is change from 5.9V to 5.8V, a changing amount of the brightness L is 0.5 nit when the data voltage is change from 5.8V to 5.7V. Further, when the reference changing amount of the brightness is 0.3 nit, the 5.8V of which the changing amount of the brightness is larger than 0.3 nit may be determined as the critical voltage.

The gamma reference voltage generator may determine the gamma reference voltage VGR by adding a margin voltage (e.g., a predetermined margin voltage) to the critical voltage. In some example embodiments, the margin voltage may be determined considering a measuring environment of the brightness of the organic light emitting display device 100.

For example, the margin voltage may be determined considering a brightness of measuring environment, a setting of the brightness measuring device 190, and a property of the display panel 110 low-brightness. The margin voltage may increase as the brightness of the measuring environment of the organic light emitting display device 100 increases. The margin voltage may be determined by a distance between a probe of the brightness measuring device 190 and the display panel 110 because light is provided between the probe and the display panel 110. The margin voltage may be determined considering a brightness difference in a location of the display panel 110 when a low-brightness image is displayed on the display panel 110.

In other example embodiments, the margin voltage may be determined based on a difference of a red driving current, a green driving current, and a blue driving current. The red driving current is a driving current provided to a red color pixel, the green driving current is a driving current provided to a green color pixel, and the blue driving current is a driving current provided to a blue color pixel. A red margin voltage, a green margin voltage and a blue margin voltage may be respectively determined because the difference of the brightness occurs by the difference of the red driving current, the green driving current, and the blue driving current.

For example, the green margin voltage may be determined smaller than the red margin voltage and the blue margin voltage because the green driving current is smaller than the red driving current and the blue driving current. In other example embodiments, the margin voltage may be determined based on a display brightness value (DBV) of the organic light emitting display device 100. For example, the margin voltage of the organic light emitting display device 100 may increase as the display brightness value decreases.

The gamma reference voltage generator 130 may determine the gamma reference voltage VGR by adding the margin voltage to the critical voltage. In some example embodiments, the gamma reference voltage generator 130 may determine a black gamma reference voltage by adding the margin voltage determined considering the measuring environment to the critical voltage. Here, the black gamma reference voltage may be a gamma reference voltage of 0 grayscale. In other example embodiments, the gamma voltage setting part 120 may determine a red gamma reference voltage, green reference voltage, and a blue reference voltage by adding the red margin voltage, the green margin voltage, and the blue margin voltage that are determined considering the difference of the red driving current, the green driving current, and the blue driving current to the critical voltage.

For example, the red gamma reference voltage may be a red gamma reference voltage of 0 grayscale, the green gamma reference voltage may be a green gamma reference voltage of 0 grayscale, and the blue gamma reference voltage may be a blue gamma reference voltage. In other example embodiments, the gamma voltage generator 130 may respectively determine the red gamma reference voltage, the green gamma reference voltage, and the blue gamma reference voltage according to the display brightness value.

The gamma reference voltage generator 130 may generate the gamma reference voltage VGR. The gamma reference voltage generator 130 may generate the gamma reference voltages VGR different from each other by the organic light emitting display device 100. Hereinafter, the gamma reference generator 130 will be described in detail referring to FIGS. 3 through 5.

The gamma voltage generator 140 may generate the gamma voltage VG based on the gamma reference voltage VGR. The gamma voltage VG generated in the gamma voltage generator 140 may be provided to the data driver 150. The gamma voltages VG may be different from each other by the organic light emitting display device 100 because the gamma reference voltages VGR are different from each other by the organic light emitting display device 100.

The scan driver 160 may provide the scan signal SCAN to the pixels through the plurality of scan lines SL. The data driver 150 may generate the data voltage DATA based on the gamma voltage VG and provide the data voltage DATA to the pixels through the data lines DL in response to the scan signal SCAN. The timing controller 170 may generate control signals CTL1 and CTL2 that respectively control the scan driver 160 and the data driver 150. The power supply 180 may provide a high power voltage ELVDD and a low power voltage ELVSS to the pixels. The power supply 180 may include at least one power providing circuit.

As described above, the organic light emitting display device 100 may generate the adjustable gamma reference voltage VGR by determining the critical voltage based on the brightness of the display panel 110 and adding the margin voltage to the critical voltage. Thus, the display quality of the organic light emitting display device 100 may improve.

Figure 3:
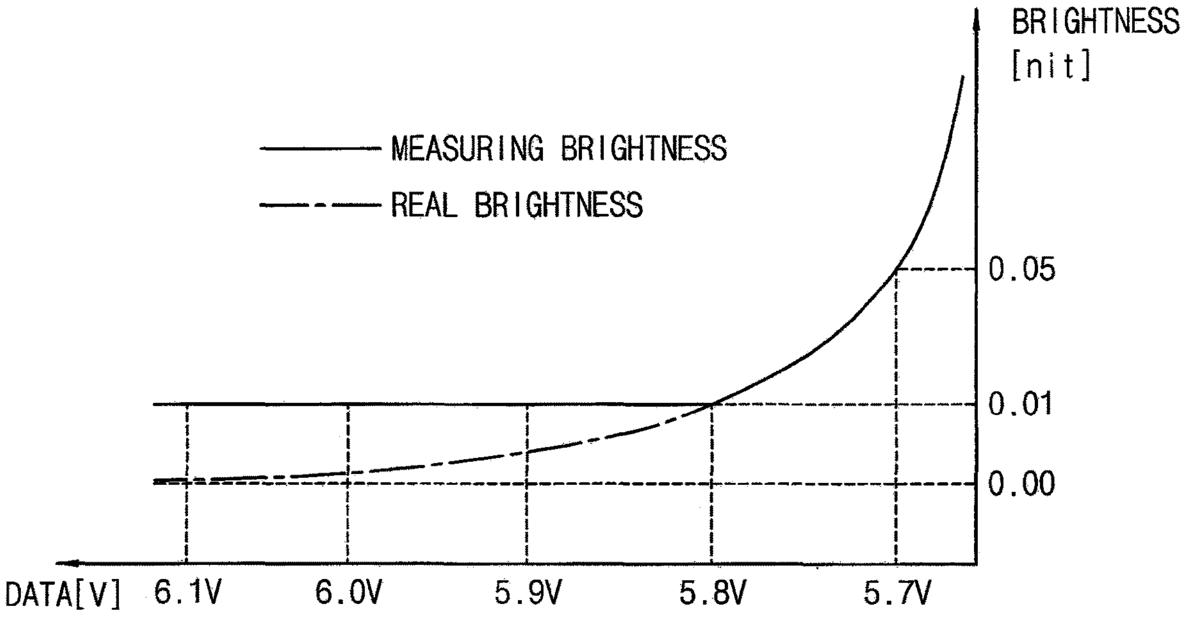
FIG. 3 is graph illustrating for describing an operation of a gamma reference voltage generator included in the organic light emitting display device of FIG. 1.

FIG. 3 is graph illustrating for describing an operation of a gamma reference voltage generator included in the organic light emitting display device of FIG. 1.

Referring to FIG. 3, the gamma reference voltage generator may provide a data voltage having a voltage level (e.g., a predetermined voltage level) to the display panel, change brightness of the display panel by sequentially reducing the data voltage, determine a critical voltage by comparing a changing amount of the brightness to a reference changing amount of the brightness (e.g., a predetermined reference changing amount of the brightness), and determine the gamma reference voltage based on the critical voltage.

The gamma reference voltage generator may provide the data voltage DATA having the predetermine voltage level to the display panel and sequentially reduce the data voltage DATA in order to determine the gamma reference voltage of 0 grayscale. As described in FIG. 3, the gamma reference voltage generator may provide the data voltage DATA having a predetermined voltage level 6.2 V to the display panel and sequentially reduce the data voltage DATA as 0.1 V. The gamma reference voltage generator may be coupled to an external brightness measuring device.

The external brightness measuring device may measure the brightness of the display panel and provide the brightness of the display panel to the gamma reference voltage generator. The brightness of the display panel may increase as the data voltage DATA decreases. For example, the brightness of the display panel may increase from 0 nit as the data voltage DATA decreases. However, the external brightness measuring device may not detect the change of the brightness. For example, the brightness measuring device may not detect the change of the brightness between 6.2 and 5.8V and may detect the change of the brightness from the 5.8V as described in FIG. 3.

The gamma reference voltage generator may determine the critical voltage by comparing a changing amount of the brightness to a predetermined reference changing amount of the brightness. For example, the gamma reference voltage generator may calculate a difference between a first brightness output from the display panel when a first data voltage is provided to the display panel and a second brightness output from the display panel when a second data voltage is provided to the display panel, and determine the difference as the changing amount of the brightness. Referring to FIG. 3, the changing amount of the brightness from 6.2V to 5.8V is nearly 0, and the changing amount of the brightness from 5.8V to 5.7 is 0.04. When the reference changing amount of the brightness is 0.04, the gamma reference voltage generator may determine the 5.8V as the critical voltage.

The gamma reference voltage generator may determine the gamma reference voltage by adding a predetermined margin voltage to the critical voltage. The margin voltage may be determined considering a measuring environment of the organic light emitting display device. For example, the margin voltage may be determined considering a brightness of the measuring environment, a setting of the brightness measuring device, a property of the display panel in low-brightness.

The margin voltage may increase as the brightness of the measuring environment increase. The margin voltage may be determined by a distance between a probe of the brightness measuring device and the display panel. The margin voltage may be determined considering a brightness difference in a location the display panel 110 when a low-brightness image is displayed on the display panel. The gamma reference voltage generator may determine a black gamma reference voltage by adding the margin voltage considering the measuring environment to the critical voltage. For example, the black gamma reference voltage may be a gamma reference voltage of 0 grayscale. For example, the gamma reference voltage of 0 grayscale may be determined as 6.3V when the critical voltage is 5.8V and the margin voltage is 0.5V.

Figure 4:
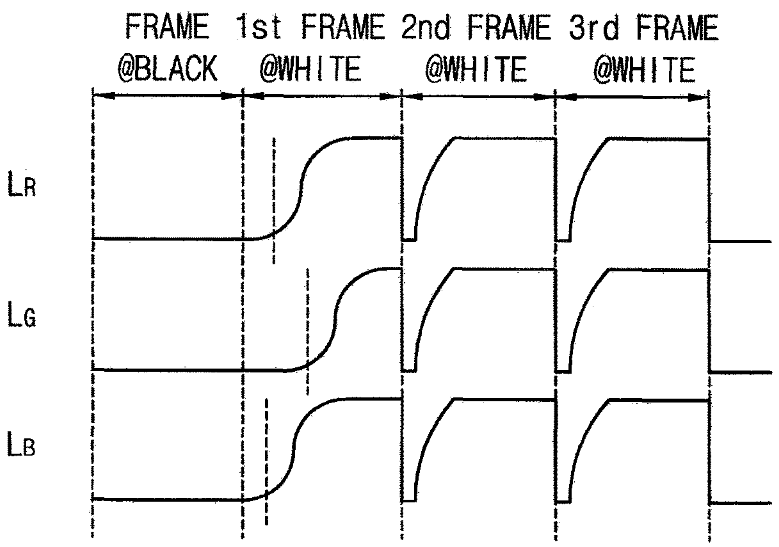
FIG. 4 is a diagram illustrating for describing an operation of a gamma reference voltage generator included in the organic light emitting display device of FIG. 1.

FIG. 4 is a diagram illustrating for describing an operation of a gamma reference voltage generator included in the organic light emitting display device of FIG. 1.

A brightness measuring device may respectively measure a red brightness (that is, a brightness of red light), a green brightness (that is, a brightness of green light), and a blue brightness (that is, a brightness of blue light). The gamma reference voltage generator may respectively determine a red critical voltage, a green critical voltage, and a blue critical voltage based on the red brightness, the green brightness, and the blue brightness provided from the brightness measuring device.

Referring to FIG. 4, the green brightness LG more decrease than the red brightness LR and the blue brightness LB in a first frame when image displayed on the display panel is changed from low brightness (e.g., a black image) to the high brightness (e.g., a white image) because a driving current provided to a green pixel is smaller than a driving current provided to a red pixel and a driving current provided to a blue pixel. Thus, the gamma reference voltage generator may determine a red margin voltage, a green margin voltage, and a blue margin voltage considering a difference between the driving current provided to the green pixel and the driving current provided to the red pixel and the blue pixel. For example, the gamma reference voltage generator may determine the red margin voltage and the blue margin voltage as 0.2V and the green margin voltage as 0.4V when the green brightness LG more decrease than the red brightness LR and the blue brightness LB as described in FIG. 4.

The gamma reference voltage generator may determine the red gamma reference voltage, the green gamma reference voltage, and the blue reference voltage by adding the red margin voltage, the green margin voltage, and the blue margin voltage determined considering the difference of the red driving current, the green driving current, and the blue driving current to the red critical voltage, the green critical voltage, and the blue critical voltage.

Figure 5A:
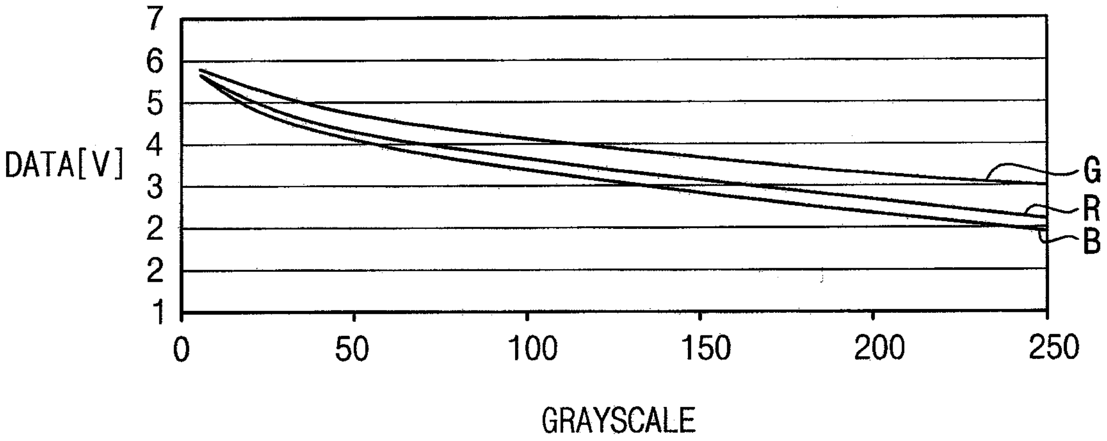
FIGS. 5A and 5B are graph illustrating for describing an operation of a gamma reference voltage generator included in the organic light emitting display device of FIG. 1.
Figure 5B:
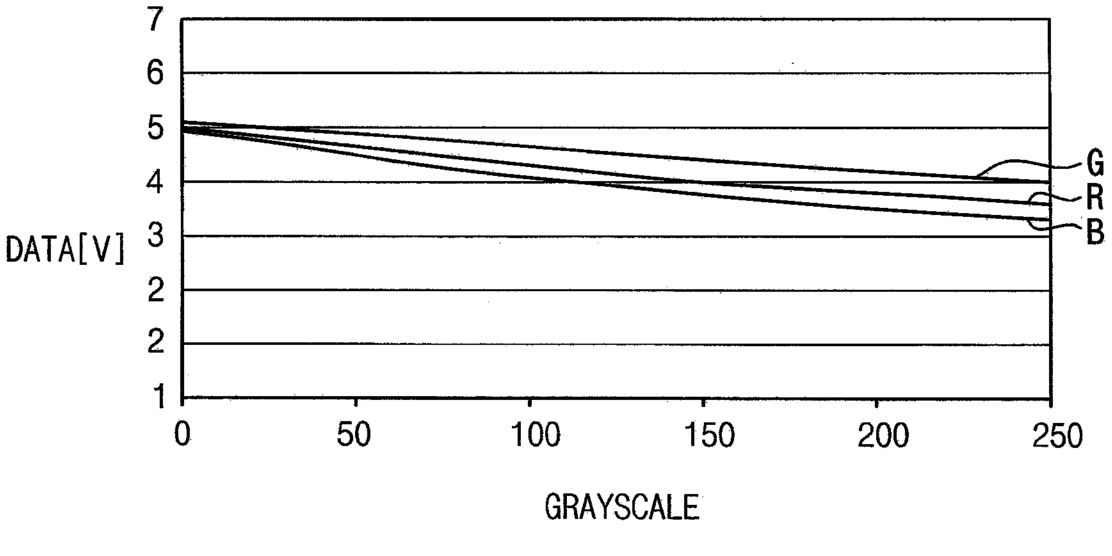

FIGS. 5A and 5B are graph illustrating for describing an operation of a gamma reference voltage generator included in the organic light emitting display device of FIG. 1.

The gamma reference voltage generator may differently determine the gamma reference voltage according to the display brightness value (DBV) of the organic light emitting display device. Generally, a data dimming method that controls an emission duty of the pixel is used in order to control the brightness of the display panel. The display brightness value DBV of the organic light emitting display device may increase as the emission duty increases.

FIG. 5A is a graph represent a data voltage by grayscale when the emission duty is 100%, and FIG. 5B is a graph represent a data voltage by grayscale when the emission duty is smaller than 50%. As described in FIGS. 5A and 5B, the data voltages of 0 grayscale may be different. For example, the data voltage of 0 grayscale may decrease as the display brightness value decrease. Thus, the gamma reference voltage generator may differently determine the margin voltage according to the display brightness value.

In some example embodiments, the gamma reference voltage generator may determine the black gamma reference voltage according to the display brightness value of the organic light emitting display device. The margin voltage may decrease as the display brightness value increases because the data voltage of 0 grayscale is increases as the display brightness value increases. The gamma reference voltage generator may be respectively determine the gamma reference voltage of the organic light emitting display device of which the display brightness value are different by respectively adding the margin voltage to the black critical voltage.

In some example embodiments, the gamma reference voltage generator may respectively determine the red gamma reference voltage, the green gamma reference voltage, and the blue gamma reference voltage according to the display brightness value of the organic light emitting display device.

The margin voltage may decrease as the display brightness value increases because the data voltage of 0 grayscale is increases as the display brightness value increases. The gamma reference voltage generator may respectively determine the red margin voltage, the green margin voltage, and the blue margin voltage further considering a difference of a red data voltage, a green data voltage, and a blue data voltage. The gamma reference voltage generator may determine the red gamma reference voltage, the green gamma reference voltage, and the blue gamma reference voltage by adding the red margin voltage, the green margin voltage, and the blue margin voltage determined by considering the difference of the red data voltage, the green data voltage, and the blue data voltage to the red critical voltage, the green critical voltage and the blue critical voltage by the display brightness value.

As described above, the gamma reference voltage generator may determine the margin voltage according to the display brightness value. Thus, dimming efficiency of each of the display brightness value may increase. The display quality of the organic light emitting display device may improve.

Figure 6:
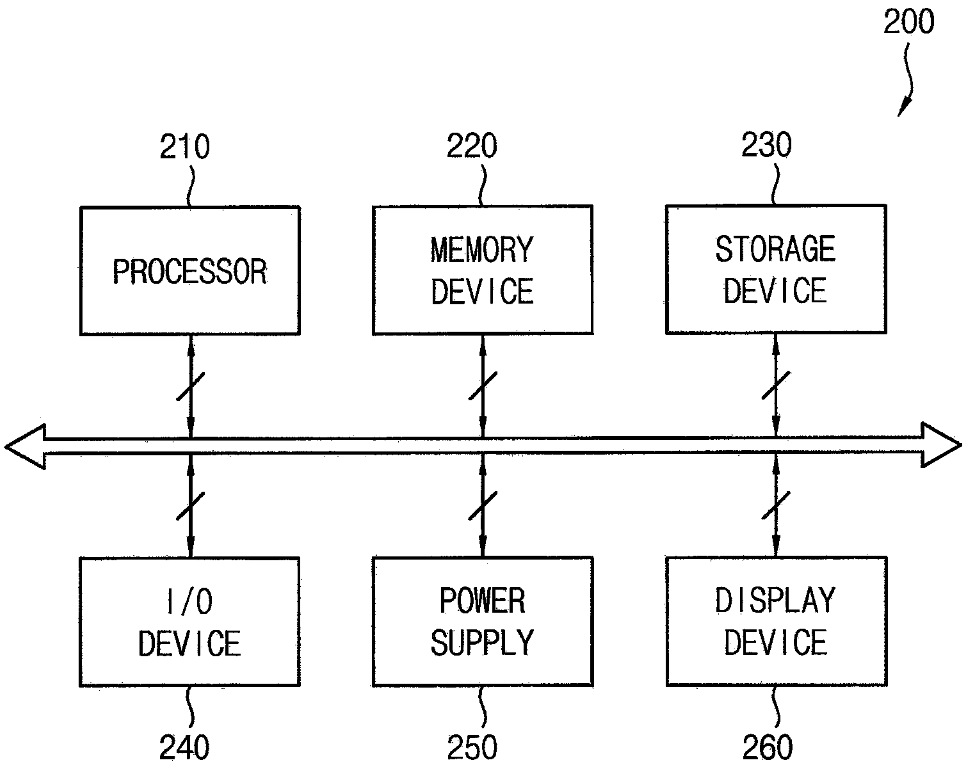
FIG. 6 is a block diagram illustrating an electronic device that includes the organic light emitting display device of FIG. 1.
Figure 7:
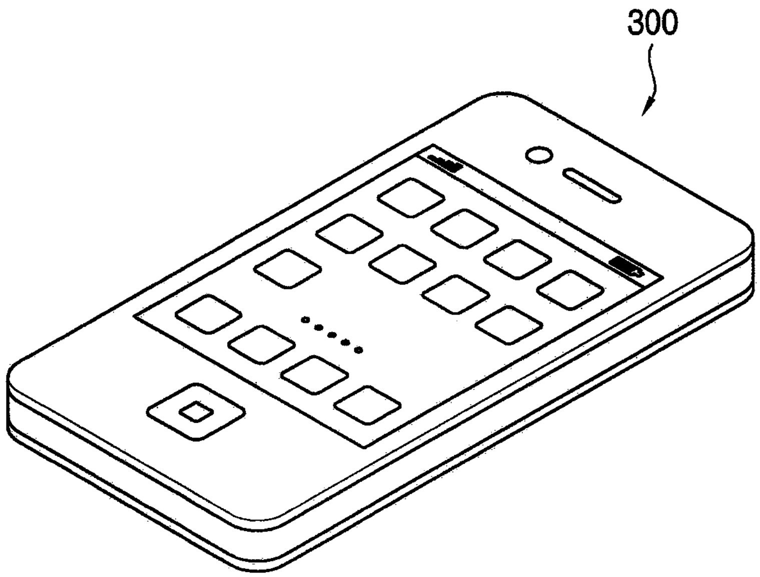
FIG. 7 is a diagram illustrating an example embodiment in which the electronic device of FIG. 6 is implemented as a smart phone.

FIG. 6 is a block diagram illustrating an electronic device that includes the organic light emitting display device of FIG. 1 and FIG. 7 is a diagram illustrating an example embodiment in which the electronic device of FIG. 6 is implemented as a smart phone.

Referring to FIGS. 6 and 7, an electronic device 200 may include a processor 210, a memory device 220, a storage device 230, an input/output (I/O) device 240, a power device 250, and a display device 260. Here, the display device 260 may correspond to the display device 100 of FIG. 1. In addition, the electronic device 200 may further include a plurality of ports for communicating a video card, a sound card, a memory card, a universal serial bus (USB) device, other electronic device, etc. Although it is illustrated in FIG. 7 that the electronic device 200 is implemented as a smart phone 300, a kind of the electronic device 200 is not limited thereto.

The processor 210 may perform various computing functions. The processor 210 may be a microprocessor, a central processing unit (CPU), etc. The processor 210 may be coupled to other components via an address bus, a control bus, a data bus, etc. Further, the processor 210 may be coupled to an extended bus such as surrounded component interconnect (PCI) bus. The memory device 220 may store data for operations of the electronic device 200. For example, the memory device 220 may include at least one non-volatile memory device such as an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, etc, and/or at least one volatile memory device such as a dynamic random access memory (DRAM) device, a static random access memory (SRAM) device, a mobile DRAM device, etc. The storage device 230 may be a solid stage drive (SSD) device, a hard disk drive (HDD) device, a CD-ROM device, etc.

The I/O device 240 may be an input device such as a keyboard, a keypad, a touchpad, a touch-screen, a mouse, etc, and an output device such as a printer, a speaker, etc. In some example embodiments, the display device 260 may be included in the I/O device 240. The power device 250 may provide a power for operations of the electronic device 200. The display device 260 may communicate with other components via the buses or other communication links.

As described above, the display device 260 may include a display panel, a gamma reference voltage generator, a gamma voltage generator, a data driver a scan driver, and a timing controller. The display panel may include a plurality of the pixels. The plurality of the pixels may be coupled to a plurality of data lines and a plurality of gate lines.

The gamma reference voltage generator may provide a data voltage having a predetermined voltage level to the display panel, change brightness of the display panel by sequentially reducing the data voltage, determine a critical voltage by comparing a changing amount of the brightness to a predetermined reference changing amount of the brightness and determine the gamma reference voltage based on the critical voltage. The gamma reference voltage generator may differently determine the gamma reference voltage of 0 grayscale by the display panel. The gamma reference voltage generator may determine the gamma reference voltage by adding a predetermine margin voltage to the critical voltage.

In some example embodiments, the margin voltage may be determined considering a measuring environment of the brightness of the display device 260. In other example embodiments, the margin voltage may be determined based on a difference of a red driving current, a green driving current, and a blue driving current. In other example embodiments, the margin voltage may be determined by a display brightness value (DBV). The gamma reference voltage generator may determine the gamma reference voltage by adding the margin voltage to the critical voltage. In some example embodiments, the gamma reference voltage generator may generate a block gamma reference voltage by adding the margin voltage determined by considering the measuring environment of the display device 260 to the critical voltage.

In some example embodiments, the gamma voltage generator may determine a red gamma reference voltage, a green gamma reference voltage, and a blue gamma reference voltage by adding a red margin voltage, a green margin voltage, and a blue margin voltage determined by considering the difference of the red driving current, the green driving current, and the blue driving current to the red critical voltage, the green critical voltage, and the blue critical voltage.

In some example embodiments, the gamma reference voltage generator may determine the black gamma reference voltage according the display brightness value of the display device 260. In some example embodiments, the gamma reference voltage generator may respectively determine the red gamma reference voltage, the green gamma reference voltage, and the blue gamma reference voltage according the display brightness value of the display device 260. The gamma reference voltage generator may generate the gamma reference voltage. The gamma voltage generator may generate a gamma voltage based on the gamma reference voltage. The scan driver may provide the scan signal to the pixel through the scan lines. The data driver may generate the data voltage based on the gamma voltage and provide the data voltage to the pixels through the data lines. The timing controller may generate control signals that control the scan driver and the data driver.

As described above, the electronic device 200 of FIG. may include the display device 260 that generates the gamma reference voltage that are different by the display device 260 by including the gamma reference voltage generator that determines the critical voltage based on the brightness of the display panel, and determines the gamma reference voltage by adding the margin voltage to the critical voltage. Thus, a display quality of the display device 260 included in the electronic device 200 may improve.

Figure 8:
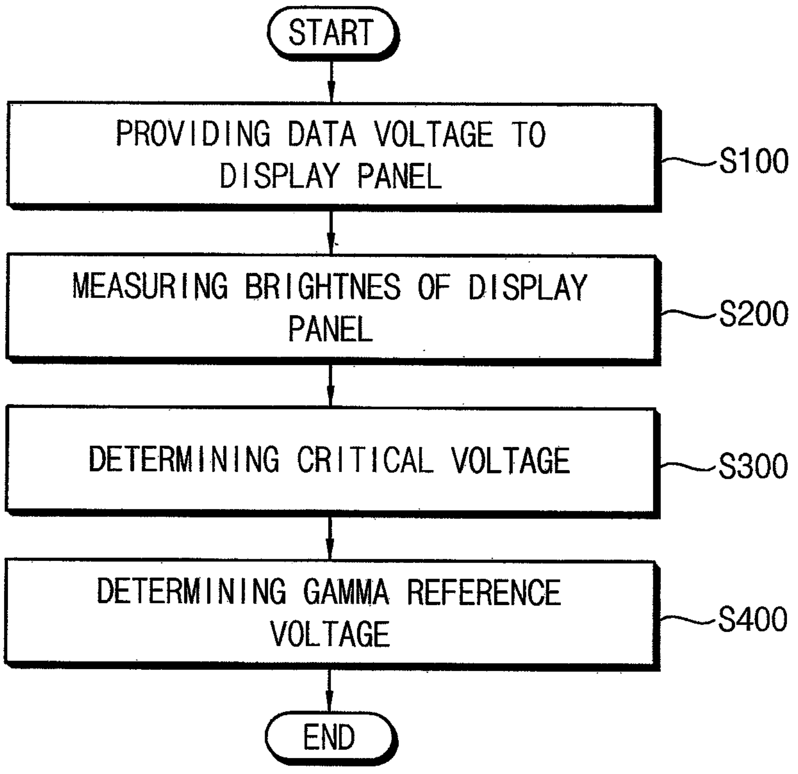
FIG. 8 is a flowchart illustrating a method for setting a gamma reference voltage of an organic light emitting display device according to some example embodiment.
Figure 9:
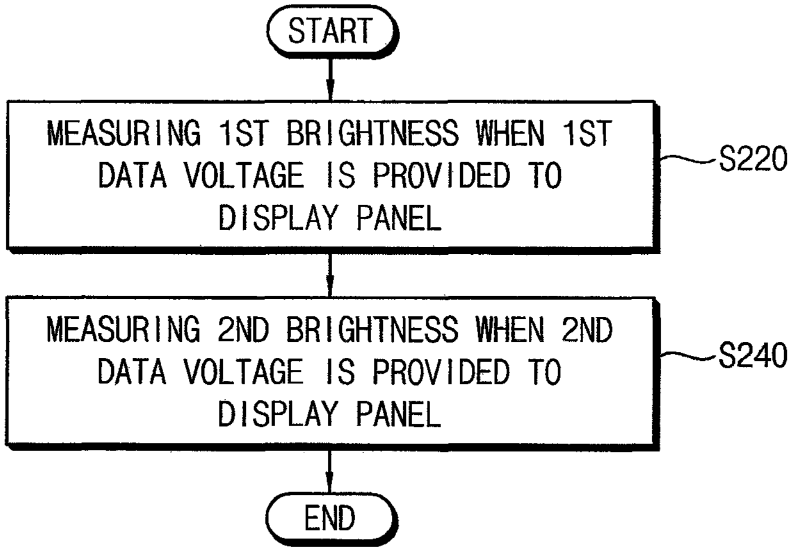
FIG. 9 is a flowchart illustrating a method for determining a critical voltage included in the method for setting the gamma reference voltage of the organic light emitting display device of FIG. 8.

FIG. 8 is a flowchart illustrating a method for setting a gamma reference voltage of an organic light emitting display device according to example embodiment and FIG. 9 is a flowchart illustrating a method for determining a critical voltage included in the method for setting the gamma reference voltage of the organic light emitting display device of FIG. 8.

Referring to FIG. 8, a method for determining a gamma reference voltage of an organic light emitting display device may include a step of providing a data voltage having a predetermined voltage level to a display panel S100, a step of measuring a brightness of the display panel as sequentially decrease the data voltage S200, a step of determining a critical voltage by comparing a changing amount of the brightness to a predetermined reference changing amount of the brightness S300, and a step of determining the gamma reference voltage based on the critical voltage S400.

The method for determining the gamma reference voltage of the organic light emitting display device may provide a data voltage having the predetermined voltage level to the display panel S100. The data voltage that displays a black image on the display panel may be provided to the display panel.

The method for determining the gamma reference voltage of the organic light emitting display device may measure the brightness of the display panel as sequentially decrease the data voltage S200. The brightness of the display panel may be changed as the data voltage is changed. The brightness of the display panel may be measured using an external brightness measuring device.

Referring to FIG. 9, the step of measuring the brightness of the display panel may include a step of measuring a first brightness of the display panel to which a first data voltage is provided S220 and a step of measuring a second brightness of the display panel to which a second data voltage of which a voltage level is smaller than a voltage level of the first voltage is provided S240. The data voltage may sequentially decrease. For example, the data voltage may be 6.2V and may decrease as 0.2V. The first brightness may be measured when the 6.2V is provided to the display panel and the second brightness may be measured when the 6.0V is provided to the display panel.

The method for determining the gamma reference voltage of the organic light emitting display device may determine the critical voltage by comparing the changing amount of the brightness to the predetermined reference changing amount of the brightness (S300). A difference between the first brightness and the second brightness may be the changing amount of the brightness. When the changing amount of the brightness is larger than the reference changing amount of the brightness, the first data voltage may be determined as the critical voltage. When the changing amount of the brightness is smaller than the reference changing amount of the brightness, the 6.0V may be provided to the display panel as the first data voltage and 5.8V may be provided to the display panel as the second data voltage. This method is repeatedly performed until the amount of the brightness is larger than the reference changing amount of the brightness The method for determining the gamma reference voltage of the organic light emitting display device may determine the gamma reference voltage based on the critical voltage S400. In some example embodiments, a black gamma reference voltage may be determined by adding a margin voltage determined considering a brightness measuring environment to the critical voltage. Here, the black gamma reference voltage may be a gamma reference voltage of 0 grayscale.

For example, the margin voltage may be determined considering a brightness of measuring environment, a setting of the brightness measuring device, and a property of the display panel low-brightness. In some example embodiments, a red gamma reference voltage, a green gamma reference voltage, and a blue gamma reference voltage may be respectively determined by adding a red margin voltage, a green margin voltage, and a blue margin voltage determined based on a difference of a red driving current, a green driving current, and a blue driving current to the critical voltage.

Here, the red gamma reference voltage may be a red gamma reference voltage of 0 grayscale, the green gamma reference voltage may be a green gamma reference voltage of 0 grayscale, and the blue gamma reference voltage may be a blue gamma reference voltage of 0 grayscale. In other example embodiments, the black gamma reference voltage may be determined by adding the margin voltage determined by a display brightness value (DBV) of the organic light emitting display device to the critical voltage.

In other example embodiments, the red gamma reference voltage, the green gamma reference voltage, and the blue gamma reference voltage may be respectively determined by adding the margin voltage determined by the display brightness value of the organic light emitting display device to the critical voltage.

As described above, the method for determining the gamma reference voltage of the organic light emitting display device may generate different gamma reference voltages corresponding to the organic light emitting display device by measuring the brightness of the display panel as decreasing the data voltage, determining the critical voltage based on the changing amount of the brightness, and determining the gamma reference voltage by adding the margin voltage to the critical voltage.

Aspects of some example embodiments may be applied to a display device and an electronic device having the display device. For example, aspects of some example embodiments may be applied to a computer monitor, a laptop, a digital camera, a cellular phone, a smart phone, a smart pad, a television, a personal digital assistant (PDA), a portable multimedia player (PMP), a MP3 player, a navigation system, a game console, a video phone, etc.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

The foregoing is illustrative of aspects of some example embodiments and is not to be construed as limiting thereof. Although aspects of some example embodiments have been described, those skilled in the art will readily appreciate that many modifications are possible in the example embodiments without materially departing from the novel teachings and aspects of embodiments of the present invention. Accordingly, all such modifications are intended to be included within the scope of the present invention as defined in the claims and their equivalents. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims and their equivalents.

What is claimed is:

1. An organic light emitting display device comprising:

a display panel including a plurality of pixels coupled to data lines and gate lines;

a gamma reference voltage generator configured to determine a gamma reference voltage and to generate the gamma reference voltage;

a gamma voltage generator configured to generate a gamma voltage based on the gamma reference voltage;

a data driver configured to provide a data voltage generated based on the gamma voltage to the data lines; and a scan driver configured to provide a scan signals to scan lines, wherein the gamma reference voltage generator is configured to provide the data voltage to the display panel, to change a brightness of the display panel by sequentially reducing the data voltage by a fixed interval amount for each sequential reduction of the data voltage, to determine a critical voltage by comparing a changing amount of the brightness to a predetermined reference changing amount of the brightness, wherein the critical voltage is determined to be a voltage level of the data voltage below which the changing amount of the brightness is larger than the predetermined reference changing amount of the brightness, and to determine the gamma reference voltage based on the critical voltage.

2. The organic light emitting display device of claim 1, wherein the gamma reference voltage generator is configured to determine the gamma reference voltage by adding a predetermined margin voltage to the critical voltage.

3. The organic light emitting display device of claim 2, wherein the margin voltage is determined based on a measuring environment of the brightness of the organic light emitting display device.

4. The organic light emitting display device of claim 2, wherein the margin voltage is determined based on a difference of a red driving current, a green driving current, and a blue driving current.

5. The organic light emitting display device of claim 2, wherein the margin voltage is determined according to a display brightness value (DBV) of the organic light emitting display device.

6. The organic light emitting display device of claim 1, wherein the gamma reference voltage generator is configured to determine a black gamma reference voltage.

7. The organic light emitting display device of claim 1, wherein the gamma reference voltage generator is configured to determine a red gamma reference voltage, a green gamma reference voltage, and a blue gamma reference voltage.

8. The organic light emitting display device of claim 1, wherein the gamma reference voltage generator is configured to determine a black gamma reference voltage based on a display brightness value (DBV) of the organic light emitting display device.

9. The organic light emitting display device of claim 1, wherein the gamma reference voltage generator is configured to respectively determine a red gamma reference voltage, a green gamma reference voltage, and a blue gamma reference voltage based on a display brightness value (DBV) of the organic light emitting display device.

10. The organic light emitting display device of claim 1, wherein the gamma reference voltage generator is configured to calculate a difference of a first brightness output from the display panel when a first data voltage is provided to the display panel and a second brightness output from the display panel when a second data voltage is provided to the display panel, and to output the difference as the changing amount of the brightness, and wherein a voltage level of the first data voltage is determined as the critical voltage when the difference is larger than the predetermined reference changing amount of the brightness.

11. The organic light emitting display device of claim 1, wherein the gamma reference voltage is respectively determined by the organic light emitting display device.

12. The organic light emitting display device of claim 1, wherein the gamma reference voltage generator is coupled to an external brightness measuring device and is configured to receive the brightness of the display panel.

13. A method for determining a gamma reference voltage of an organic light emitting display device, the method comprising:

providing a data voltage to a display panel;

measuring a brightness of the display panel as the data voltage is sequentially decreased by a fixed interval amount for each sequential reduction of the data voltage;

determining a critical voltage by comparing a changing an amount of the brightness to a predetermined reference changing amount of the brightness, wherein the critical voltage is determined to be a voltage level of the data voltage below which the changing amount of the brightness is larger than the predetermined reference changing amount of the brightness; and determining the gamma reference voltage based on the critical voltage.

14. The method of claim 13, wherein the gamma reference voltage is determined by adding a predetermined margin voltage to the critical voltage.

15. The method of claim 13, wherein a black gamma reference voltage is determined by adding a margin voltage based on a measuring environment of brightness to the critical voltage.

16. The method of claim 13, wherein a red gamma reference voltage, a green gamma reference voltage, and a blue gamma reference voltage are respectively determined by adding a red margin voltage, a green margin voltage, and a blue margin voltage calculated by a difference between a red driving current, a green driving current, and a blue driving current to the critical voltage.

17. The method of claim 13, wherein a black gamma reference voltage is determined by adding a margin voltage calculated based on a display brightness value (DBV) of the organic light emitting display device to the critical voltage.

18. The method of claim 13, wherein a red gamma reference voltage, a green gamma reference voltage, and a blue gamma reference voltage are respectively determined by adding a margin voltage calculated based on a display brightness value (DBV) of the organic light emitting display device.

19. The method of claim 13, wherein measuring a brightness of the display panel as the data voltage is sequentially decreased includes:

measuring a first brightness output from the display panel when a first data voltage is provided to the display panel; and measuring a second brightness output from the display panel when a second data voltage that is smaller than the first data voltage is provided to the display panel.

20. The method of claim 19, wherein a voltage level of the first data voltage is determined as the critical voltage when a changing amount of the first brightness and the second brightness is larger than the predetermined reference changing amount of the brightness.

* * * * *